United States Patent
Jo

(10) Patent No.: US 10,460,826 B2
(45) Date of Patent: Oct. 29, 2019

(54) TEST METHODS OF SEMICONDUCTOR DEVICES AND SEMICONDUCTOR SYSTEMS USED THEREIN

(71) Applicant: SK hynix Inc., Icheon-si, Gyeonggi-do (KR)

(72) Inventor: Sang Gu Jo, Bucheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 62 days.

(21) Appl. No.: 15/467,373

(22) Filed: Mar. 23, 2017

(65) Prior Publication Data

US 2018/0068743 A1    Mar. 8, 2018

(30) Foreign Application Priority Data

Sep. 5, 2016    (KR) .................. 10-2016-0113705

(51) Int. Cl.
| | |
|---|---|
| *G11C 29/00* | (2006.01) |
| *G06F 3/06* | (2006.01) |
| *G11C 29/18* | (2006.01) |
| *G11C 29/42* | (2006.01) |
| *G11C 5/04* | (2006.01) |

(52) U.S. Cl.
CPC .......... *G11C 29/765* (2013.01); *G06F 3/0619* (2013.01); *G06F 3/0638* (2013.01); *G06F 3/0655* (2013.01); *G06F 3/0679* (2013.01); *G11C 29/18* (2013.01); *G11C 29/42* (2013.01); *G11C 5/04* (2013.01)

(58) Field of Classification Search
CPC ..... G11C 29/44; G11C 29/4401; G11C 29/76; G11C 2029/4402; G11C 29/72; G11C 29/808
See application file for complete search history.

(56) References Cited

U.S. PATENT DOCUMENTS

| | | | | |
|---|---|---|---|---|
| 5,179,536 A | * | 1/1993 | Kasa ................... | G11C 11/407 365/185.04 |
| 5,293,348 A | * | 3/1994 | Abe ..................... | G11C 29/808 365/200 |
| 5,469,390 A | * | 11/1995 | Sasaki ................. | G11C 29/808 365/200 |

(Continued)

FOREIGN PATENT DOCUMENTS

KR    1020140067875 A    6/2014

*Primary Examiner* — Steve N Nguyen

(74) *Attorney, Agent, or Firm* — William Park & Associates Ltd.

(57) ABSTRACT

A semiconductor system includes a medium controller and a semiconductor module. The medium controller outputs an address that is sequentially counted in a test mode, senses levels of data corresponding to the address in the test mode to determine if the data has a row error or a chip error, and changes a combination of a host address to generate and store a spare address if a combination of the address corresponds to the chip error in the test mode. The semiconductor module includes a plurality of semiconductor devices. The semiconductor module repairs the address to output the data from a redundancy area if a combination of the address corresponds to the row error. The semiconductor module outputs the data from a spare area selected by the spare address if a combination of the address corresponds to the chip error.

17 Claims, 6 Drawing Sheets

(56) References Cited

U.S. PATENT DOCUMENTS

| | | | | |
|---|---|---|---|---|
| 5,920,515 | A | * | 7/1999 | Shaik .................. G11C 29/844 365/200 |
| 6,108,252 | A | * | 8/2000 | Park ................ G11C 29/50012 365/189.07 |
| 7,159,141 | B2 | * | 1/2007 | Lakhani ................. G11C 29/76 714/6.13 |
| 7,315,479 | B2 | * | 1/2008 | Kurozumi .............. G11C 29/24 365/189.12 |
| 2002/0049938 | A1 | * | 4/2002 | Ko .................... G11B 20/1258 714/710 |
| 2009/0006886 | A1 | | 1/2009 | O'Connor et al. |
| 2009/0132876 | A1 | * | 5/2009 | Freking ................ G06F 11/106 714/723 |
| 2010/0064186 | A1 | * | 3/2010 | Houg .................... G11C 29/76 714/711 |

\* cited by examiner

TEST METHODS OF SEMICONDUCTOR DEVICES AND SEMICONDUCTOR SYSTEMS USED THEREIN

CROSS-REFERENCE TO RELATED APPLICATIONS

The present application claims priority under 35 U.S.C 119(a) to Korean Application No. 10-2016-0113705, filed on Sep. 5, 2016, which is incorporated herein by reference in its entirety.

BACKGROUND

1. Technical Field

Embodiments of the present disclosure relate to test methods of semiconductor devices and semiconductor systems used in the test methods.

2. Related Art

Recently, a DDR2 scheme or a DDR3 scheme of receiving and outputting four bit data or eight bit data during each clock cycle has been used to improve an operation speed of semiconductor devices. If the data transmission speed of the semiconductor devices becomes faster, there may be an increase in the probability of errors occurring while the semiconductor device transmits data. Accordingly, novel design schemes have been proposed to improve the reliability of data transmission.

Whenever the semiconductor device transmits data, error codes capable of detecting data transmission errors may be generated and transmitted with the data to improve the reliability of data transmission. The error codes may include an error detection code (EDC) which is capable of detecting errors and an error correction code (ECC) which is capable of correcting errors by itself.

SUMMARY

According to an embodiment, a semiconductor system includes a medium controller and a semiconductor module. The medium controller outputs an address that is sequentially counted in a test mode, senses levels of data corresponding to the address in the test mode to determine if the data has a row error or a chip error, and changes a combination of a host address to generate and store a spare address if a combination of the address corresponds to the chip error in the test mode. The semiconductor module includes a plurality of semiconductor devices. The semiconductor module repairs the address to output the data from a redundancy area if a combination of the address corresponds to the row error. The semiconductor module outputs the data from a spare area selected by the spare address if a combination of the address corresponds to the chip error.

According to another embodiment, a semiconductor system includes a medium controller, a first semiconductor device and a second semiconductor device. The medium controller outputs an address that is sequentially counted in a test mode and senses levels of a first datum and a second datum corresponding to the address in the test mode to determine if the first and second data have a row error or a chip error. The first semiconductor device includes a first memory area, a first redundancy area, and a first spare area. The first semiconductor device outputs the first datum from the first memory area in the test mode, receives and outputs the first datum from the first redundancy area if a combination of the address corresponds to the row error, and receives and outputs the first datum from the first spare area if a combination of the address corresponds to the chip error. The second semiconductor device includes a second memory area, a second redundancy area, and a second spare area. The second semiconductor device outputs the second datum from the second memory area in the test mode, receives and outputs the second datum from the second redundancy area if a combination of the address corresponds to the row error, and receives and outputs the second datum from the second spare area if a combination of the address corresponds to the chip error.

According to another embodiment, there is provided a test method of a semiconductor system. The test method includes reading out data from a plurality of semiconductor devices according to a combination of an address that is sequentially counted in a test mode, sensing levels of the data to determine if the data has a row error or a chip error, repairing the address to receive and output the data from a redundancy area if the data have the row error, and changing a combination of the address to receive and output the data from a spare area if the data have the chip error.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
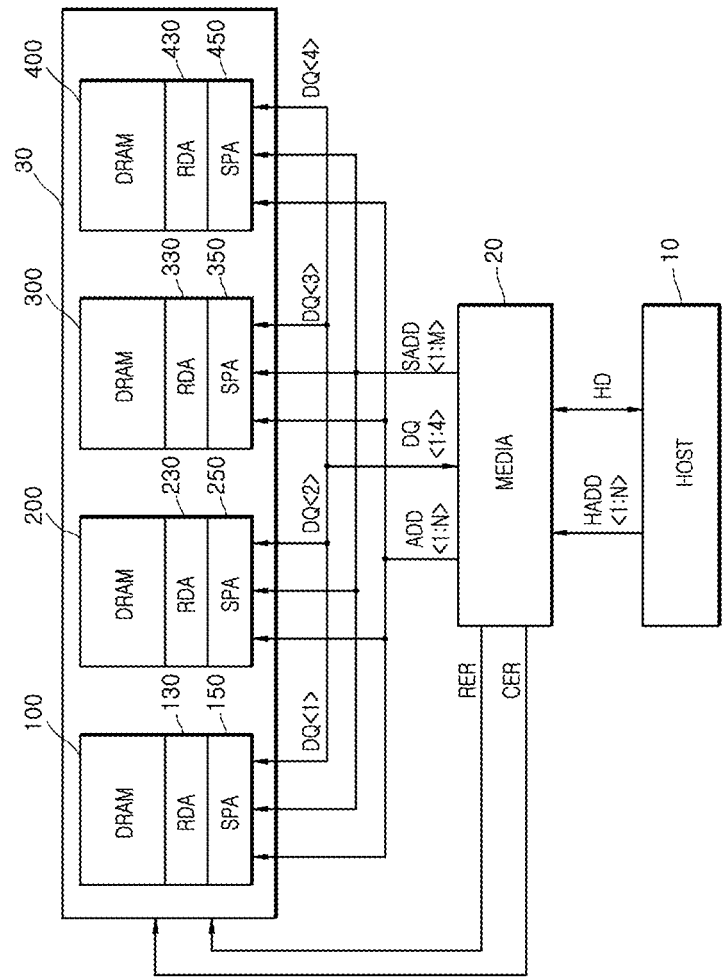
FIG. 1 is a block diagram illustrating a configuration of a semiconductor system according to an embodiment.

As illustrated in FIG. 1, a semiconductor system according to an embodiment may include a host 10, a medium controller 20, and a semiconductor module 30. The semiconductor module 30 may include a first semiconductor device 100, a second semiconductor device 200, a third semiconductor device 300, and a fourth semiconductor device 400.

The host 10 may apply a host address HADD<1:N> and host data HD to the medium controller 20. The host 10 may apply the host address HADD<1:N>, which is sequentially counted, to the medium controller 20 in a test mode. The host 10 may apply the host data HD to the medium controller 20 after the test mode. The host 10 may receive the host data HD from the medium controller 20 after the test mode. The number "N" of bits of the host address HADD<1:N> may be a natural number. The number "N" of bits of the host address HADD<1:N> may be set to be different according to the embodiment. Although the host data HD is illustrated as a single signal line in FIG. 1, the number of bits of the host data HD may be set to be two or more according to the embodiment.

The medium controller 20 may receive the host address HADD<1:N> from the host 10 and the medium controller 20 may output the host address HADD<1:N> as an address ADD<1:N>. The medium controller 20 may read out first to fourth data DQ<1:4> from the plurality of semiconductor devices 100, 200, 300, and 400 according to a combination of the address ADD<1:N> that is sequentially counted in the test mode. The medium controller 20 may sense levels of first to fourth data DQ<1:4> in the test mode to determine if the semiconductor module 30 has a row error or a chip error. The medium controller 20 may change a combination of the host address HADD<1:N> and thus the address ADD<1:N> to generate and store a spare address SADD<1:M> if a combination of the address ADD<1:N> received by the semiconductor module 30 corresponds to a chip error in the test mode. The medium controller 20 may output a row error signal RER, which is enabled, to the semiconductor module 30 if the semiconductor module 30 has a row error in the test mode. The medium controller 20 may output a chip error signal CER, which is enabled, to the semiconductor module 30 if the semiconductor module 30 has a chip error in the test mode. The first datum DQ<1> may be datum which is inputted to and outputted from the first semiconductor device 100. The second datum DQ<2> may be datum which is inputted to and outputted from the second semiconductor device 200. The third datum DQ<3> may be datum which is inputted to and outputted from the third semiconductor device 300. The fourth datum DQ<4> may be datum which is inputted to and outputted from the fourth semiconductor device 400. The first to fourth data DQ<1:4> may be set to be multi-bit data. The first to fourth data DQ<1:4> may be sequentially outputted. A row error may correspond to an error which occurs in any one of the first to fourth semiconductor devices 100, 200, 300 and 400. A chip error may correspond to an error which occurs in at least two of the first to fourth semiconductor devices 100, 200, 300 and 400.

The first semiconductor device 100 may include a first memory area (corresponding to a memory area 120 of FIG. 3), a first redundancy area 130, and a first spare area 150. The first semiconductor device 100 may output the first datum DQ<1> from the first memory area (120 of FIG. 3) in response to receiving the address ADD<1:N> in the test mode. The first semiconductor device 100 may receive and output the first datum DQ<1> from the first memory area (120 of FIG. 3) in response to receiving an address ADD<1:N>, after the test mode. The first semiconductor device 100 may receive and output the first datum DQ<1> from the first redundancy area 130 if a combination of the address ADD<1:N> corresponds to the row error, after the test mode. The first semiconductor device 100 may receive and output the first datum DQ<1> from the first redundancy area 130 in response to receiving a row error signal RER, after the test mode. The first semiconductor device 100 may repair the address ADD<1:N> to receive and output the first datum DQ<1> if a combination of the address ADD<1:N> corresponds to a row error, after the test mode. The first semiconductor device 100 may receive and output the first datum DQ<1> from the first spare area 150 if a combination of the address ADD<1:N> corresponds to a chip error, after the test mode. The first semiconductor device 100 may receive and output the first datum DQ<1> from the first spare area 150 in response to receiving a chip error signal CER, after the test mode. The first semiconductor device 100 may receive and output the first datum DQ<1> from the first spare area 150 in response to receiving a spare address SADD<1:M> if a combination of the address ADD<1:N> corresponds to the chip error, after the test mode.

The second semiconductor device 200 may include a second memory area (not shown), a second redundancy area 230, and a second spare area 250. The second semiconductor device 200 may output the second datum DQ<2> from the second memory area in response to receiving an address ADD<1:N> in the test mode. The second semiconductor device 200 may receive and output the second datum DQ<2> from the second memory area in response to receiving an address ADD<1:N>, after the test mode. The second semiconductor device 200 may receive and output the second datum DQ<2> from the second redundancy area 230 if a combination of the address ADD<1:N> corresponds to the row error, after the test mode. The second semiconductor device 200 may receive and output the second datum DQ<2> from the second redundancy area 230 in response to receiving a row error signal RER, after the test mode. The second semiconductor device 200 may repair the address ADD<1:N> to receive and output the second datum DQ<2> if a combination of the address ADD<1:N> corresponds to a row error, after the test mode. The second semiconductor device 200 may receive and output the second datum DQ<2> from the second spare area 250 if a combination of the address ADD<1:N> corresponds to a chip error, after the test mode. The second semiconductor device 200 may receive and output the second datum DQ<2> from the second spare area 250 in response to receiving a chip error signal CER, after the test mode. The second semiconductor device 200 may receive and output the second datum DQ<2> from the second spare area 250 in response to receiving a spare address SADD<1:M> if a combination of the address ADD<1:N> corresponds to the chip error, after the test mode.

The third semiconductor device 300 may include a third memory area (not shown), a third redundancy area 330, and a third spare area 350. The third semiconductor device 300 may output the third datum DQ<3> from the third memory area in response to receiving an address ADD<1:N> in the test mode. The third semiconductor device 300 may receive and output the third datum DQ<3> from the third memory area in response to receiving an address ADD<1:N>, after the test mode. The third semiconductor device 300 may receive and output the third datum DQ<3> from the third redundancy area 330 if a combination of the address ADD<1:N> corresponds to the row error, after the test mode. The third semiconductor device 300 may receive and output the third datum DQ<3> from the third redundancy area 330 in response to receiving a row error signal RER, after the test mode. The third semiconductor device 300 may repair the address ADD<1:N> to receive and output the third datum DQ<3> if a combination of the address ADD<1:N> corresponds to a row error, after the test mode. The third semiconductor device 300 may receive and output the third datum DQ<3> from the third spare area 350 if a combination of the address ADD<1:N> corresponds to a chip error, after the test mode. The third semiconductor device 300 may receive and output the third datum DQ<3> from the third spare area 350 in response to receiving a chip error signal CER, after the test mode. The third semiconductor device 300 may receive and output the third datum DQ<3> from the third spare area 350 in response to receiving a spare address SADD<1:M> if a combination of the address ADD<1:N> corresponds to the chip error, after the test mode.

The fourth semiconductor device 400 may include a fourth memory area (not shown), a fourth redundancy area 430, and a fourth spare area 450. The fourth semiconductor device 400 may output the fourth datum DQ<4> from the fourth memory area in response to receiving an address ADD<1:N> in the test mode. The fourth semiconductor device 400 may receive and output the fourth datum DQ<4> from the fourth memory area in response to receiving an address ADD<1:N>, after the test mode. The fourth semiconductor device 400 may receive and output the fourth datum DQ<4> from the fourth redundancy area 430 if a combination of the address ADD<1:N> corresponds to the row error, after the test mode. The fourth semiconductor device 400 may receive and output the fourth datum DQ<4> from the fourth redundancy area 430 in response to receiving a row error signal RER, after the test mode. The fourth semiconductor device 400 may repair the address ADD<1:N> to receive and output the fourth datum DQ<4> if a combination of the address ADD<1:N> corresponds to a row error, after the test mode. The fourth semiconductor device 400 may receive and output the fourth datum DQ<4> from the fourth spare area 450 if a combination of the address ADD<1:N> corresponds to a chip error, after the test mode. The fourth semiconductor device 400 may receive and output the fourth datum DQ<4> from the fourth spare area 450 in response to receiving a chip error signal CER, after the test mode. The fourth semiconductor device 400 may receive and output the fourth datum DQ<4> from the fourth spare area 450 in response to receiving a spare address SADD<1:M> if a combination of the address ADD<1:N> corresponds to the chip error, after the test mode. Further, the first to fourth semiconductor devices 100, 200, 300 and 400 may sequentially output data from memory areas selected by the address ADD<1:N> in the test mode.

Figure 2:
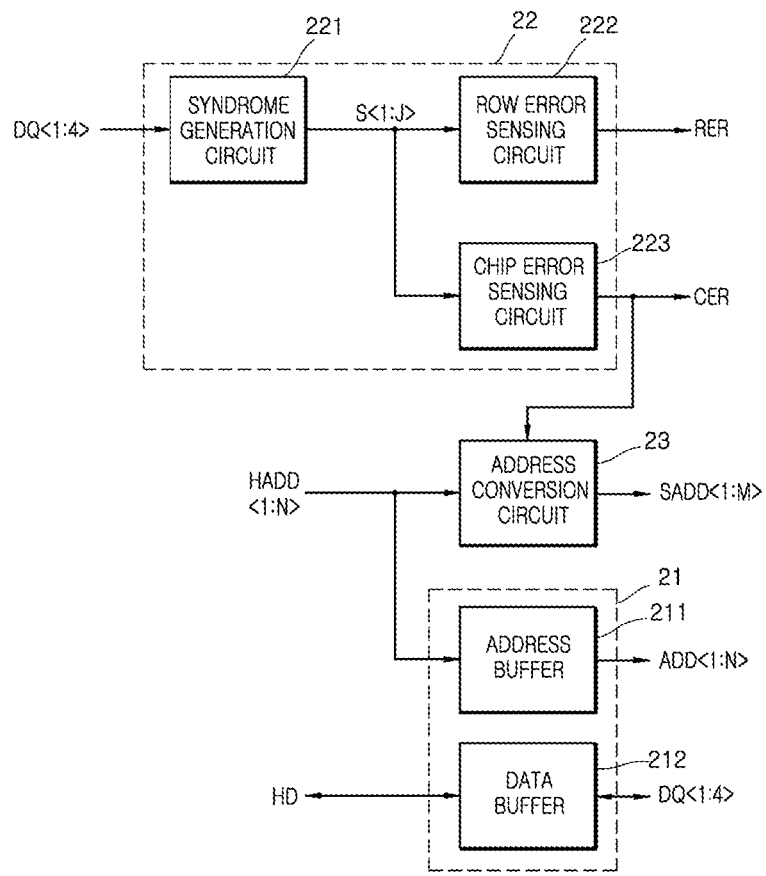
FIG. 2 is a block diagram illustrating a configuration of an example of a medium controller included in the semiconductor system of FIG. 1.

Referring to FIG. 2, the medium controller 20 may include a buffer circuit 21, an error sensing circuit 22, and an address conversion circuit 23.

The buffer circuit 21 may include an address buffer 211 and a data buffer 212.

The address buffer 211 may buffer the host address HADD<1:N> to output the buffered host address as the address ADD<1:N> during a read operation or a write operation. The address buffer 211 may apply the address ADD<1:N> to the first to fourth semiconductor devices 100, 200, 300 and 400 during the read operation or the write operation.

The data buffer 212 may buffer the host data HD to output the buffered host data as the first to fourth data DQ<1:4> during the write operation. The data buffer 212 may apply the first to fourth data DQ<1:4> to the first to fourth semiconductor devices 100, 200, 300 and 400 during the write operation. In such a case, the first to fourth data DQ<1:4> may be applied to the first to fourth semiconductor devices 100, 200, 300 and 400, respectively. The data buffer 212 may buffer the first to fourth data DQ<1:4> to output the buffered first to fourth data as the host data HD during the read operation. The data buffer 212 may apply the host data HD to the host 10 during the read operation.

The error sensing circuit 22 may include a syndrome generation circuit 221, a row error sensing circuit 222, and a chip error sensing circuit 223.

The syndrome generation circuit 221 may sense levels of the first to fourth data DQ<1:4> to generate a syndrome signal S<1:J>. The syndrome generation circuit 221 may generate the syndrome signal S<1:3> including information on errors included in the first to fourth data DQ<1:4>, in the test mode. The number of bits of the syndrome signal S<1:3> may be set so that the syndrome signal S<1:3> includes information on errors included in the first to fourth data DQ<1:4>. The number of bits of the syndrome signal S<1:3> may be set to be different according to the embodiments. The syndrome signal S<1:J> may be generated using an error correction code (ECC) scheme.

The row error sensing circuit 222 may generate the row error signal RER which is enabled in response to the syndrome signal S<1:3> if the information included in the syndrome signal S<1:J> corresponds to a row error. The row error sensing circuit 222 may generate the row error signal RER from the information included in the syndrome signal S<1:J>. That is, the row error sensing circuit 222 may generate the row error signal RER from information on errors included in the first to fourth data DQ<1:4>. For example, the row error sensing circuit 222 may generate a row error signal RER which is enabled if only one of the first to fourth data DQ<1:4> is an erroneous datum.

The chip error sensing circuit 223 may generate a chip error signal CER which is enabled in response to the syndrome signal S<1:3> if information included in the syndrome signal S<1:J> corresponds to a chip error. The chip error sensing circuit 223 may generate the chip error signal CER from information included in the syndrome signal S<1:J>. That is, the chip error sensing circuit 223 may generate a chip error signal CER from information on errors included in the first to fourth data DQ<1:4>. For example, the chip error sensing circuit 223 may generate a chip error signal CER which is enabled if at least two of the first to fourth data DQ<1:4> are erroneous data, i.e. have a chip error.

The address conversion circuit 23 may change a combination of the host address HADD<1:N> to generate and store the spare address SADD<1:M> in the test mode, in response to the chip error signal CER. The address conversion circuit 23 may output the spare address SADD<1:M> in response to the chip error signal CER after the completion of the test mode if a combination of the host address HADD<1:N> corresponds to a chip error that may have occurred.

Figure 3:
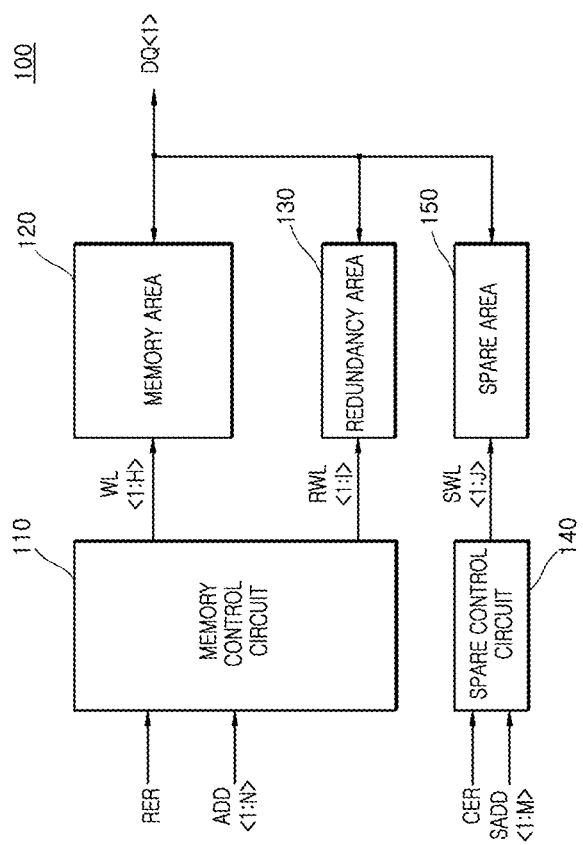
FIG. 3 is a block diagram illustrating a configuration of an example of a first semiconductor device included in the semiconductor system of FIG. 1.

Referring to FIG. 3, the first semiconductor device 100 may include a memory control circuit 110, a memory area 120 (i.e., a first memory area), a redundancy area 130 (i.e., a first redundancy area), a spare control circuit 140, and a spare area 150 (i.e., a first spare area).

The memory control circuit 110 may decode the address ADD<1:N> in response to the row error signal RER to selectively activate any one of first word lines WL<1:H> of the first memory area 120. The memory control circuit 110 may decode the address ADD<1:N> to selectively activate any one of the first word lines WL<1:H> of the first memory area 120, if the row error signal RER is disabled. The memory control circuit 110 may repair the address ADD<1:N> in response to the row error signal RER to selectively activate any one of first redundancy word lines RWL<1:I> of the first redundancy area 130. The memory control circuit 110 may repair the address ADD<1:N> to selectively activate any one of the first redundancy word lines RWL<1:I> of the first redundancy area 130 if the row error signal RER is enabled. A repair operation of the address ADD<1:N> means an operation in which the memory control circuit 110 selectively activates one of the first redundancy word lines RWL<1:I> of the first redundancy area 130 without activation of the first word lines WL<1:H> of the first memory area 120, according to the address ADD<1:N>.

The first memory area 120 may receive and store the first datum DQ<1> into a memory cell (not shown) connected to one of the first word lines WL<1:H>, which is selectively activated during the write operation. The first memory area 120 may output the first datum DQ<1> stored in a memory cell (not shown) connected to one of the first word lines WL<1:H>, which is selectively activated during the read operation.

The first redundancy area 130 may receive and store the first datum DQ<1> into a memory cell (not shown) connected to one of the first redundancy word lines RWL<1:I>, which is selectively activated during the write operation. The first redundancy area 130 may output the first datum DQ<1> stored in a memory cell (not shown) connected to one of the first redundancy word lines RWL<1:I>, which is selectively activated during the read operation.

The spare control circuit 140 may decode the spare address SADD<1:M> in response to the chip error signal CER to selectively activate any one of first spare word lines SWL<1:J> of the first spare area 150. The spare control circuit 140 may decode the spare address SADD<1:M> to selectively activate any one of first spare word lines SWL<1:J> of the first spare area 150 if the chip error signal CER is enabled.

The first spare area 150 may receive and store the first datum DQ<1> into a memory cell (not shown) connected to one of the first spare word lines SWL<1:J>, which is selectively activated during the write operation. The first spare area 150 may output the first datum DQ<1> stored in a memory cell (not shown) connected to one of the first spare word lines SWL<1:J>, which is selectively activated during the read operation.

Each of the second, third and fourth semiconductor devices 200, 300 and 400 illustrated in FIG. 1 may be realized to have substantially the same configuration as the first semiconductor device 100 illustrated in FIG. 3 except input/output (I/O) signals thereof. Thus, detailed descriptions of the second, third, and fourth semiconductor devices 200, 300 and 400 will be omitted hereinafter.

Figure 4:
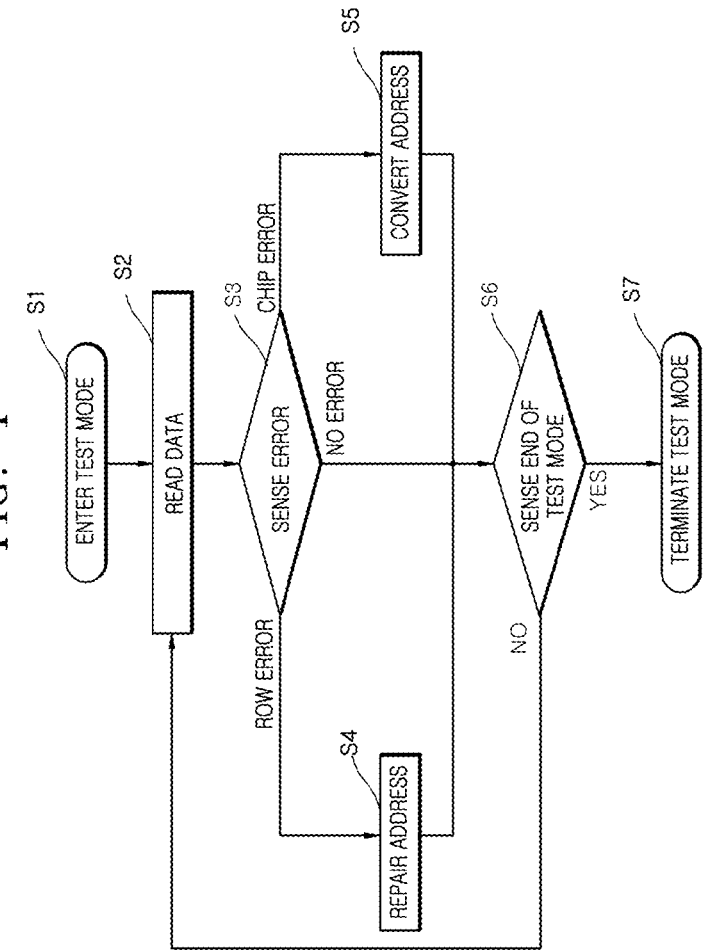
FIG. 4 is a flowchart illustrating a test method according to an embodiment.

A test method according to an embodiment will be described hereinafter with reference to FIG. 4 in conjunction with an example in which no error is present in the first to fourth data DQ<1:4>.

First, the medium controller 20 may receive the host address HADD<1:N> that is sequentially counted and may output the host HADD<1:N> as the address ADD<1:N> to put the semiconductor system into the test mode (see a step S1).

Next, the first semiconductor device 100 may output the first datum DQ<1> from the first memory area (120 of FIG. 3) in response to the address ADD<1:N> (see a step S2).

The second semiconductor device 200 may output the second datum DQ<2> from the second memory area (not shown) in response to the address ADD<1:N> (see the step S2).

The third semiconductor device 300 may output the third datum DQ<3> from the third memory area (not shown) in response to the address ADD<1:N> (see the step S2).

The fourth semiconductor device 400 may output the fourth datum DQ<4> from the fourth memory area (not shown) in response to the address ADD<1:N> (see the step S2).

During the step S2, the first to fourth data DQ<1:4> may be sequentially outputted from the semiconductor module 30.

Next, the syndrome generation circuit 221 of the medium controller 20 may receive the first to fourth data DQ<1:4> to generate the syndrome signal S<1:3> (see a step S3).

The row error sensing circuit 222 of the medium controller 20 may generate the row error signal RER which is disabled in response to the syndrome signal S<1:3> if no error is in the first to fourth data DQ<1:4>.

The chip error sensing circuit 223 of the medium controller 20 may generate the chip error signal CER which is disabled in response to the syndrome signal S<1:3> because there is no error in the first to fourth data DQ<1:4>.

Next, the semiconductor system may be put into a step for sensing levels of first to fourth data DQ<1:4> followed by sensing termination of the test mode because there is no error in the first to fourth data DQ<1:4> (see a step S6).

Next, if the address ADD<1:N> is not a final address which is fully counted the data may be read out via word lines, and the semiconductor system may be put into step S2. In contrast, if the address ADD<1:N> is the final address which is fully counted, the semiconductor system may be put into step S7 for terminating the test mode.

A test method according to another embodiment will be described hereinafter with reference to FIG. 4 in conjunction with an example in which a row error occurs. In such a case, it is assumed that an error occurs only in the first semiconductor device 100.

First, the medium controller 20 may receive the host address HADD<1:N> that is sequentially counted and may output the host HADD<1:N> as the address ADD<1:N> to put the semiconductor system into the test mode (see the step S1).

Next, the first semiconductor device 100 may output the first datum DQ<1> from the first memory area (120 of FIG. 3) in response to the address ADD<1:N> (see the step S2).

The second semiconductor device 200 may output the second datum DQ<2> from the second memory area (not shown) in response to the address ADD<1:N> (see the step S2).

The third semiconductor device 300 may output the third datum DQ<3> from the third memory area (not shown) in response to the address ADD<1:N> (see the step S2).

The fourth semiconductor device 400 may output the fourth datum DQ<4> from the fourth memory area (not shown) in response to the address ADD<1:N> (see the step S2).

During the step S2, the first to fourth data DQ<1:4> may be sequentially outputted from the semiconductor module 30.

Next, the syndrome generation circuit 221 of the medium controller 20 may receive the first to fourth data DQ<1:4> to generate the syndrome signal S<1:3> (see the step S3). In such a case, the syndrome signal S<1:3> may be generated to include information on an error of the first datum DQ<1>.

The row error sensing circuit 222 of the medium controller 20 may generate the row error signal RER which is enabled in response to the syndrome signal S<1:3> because the syndrome signal S<1:3> includes only information on the error of the first datum DQ<1>.

The chip error sensing circuit 223 of the medium controller 20 may generate the chip error signal CER which is disabled in response to the syndrome signal S<1:3> because the syndrome signal S<1:J> includes only information on the error of the first datum DQ<1>.

Next, the semiconductor system may be put into a step for repairing the address ADD<1:N> because the syndrome signal S<1:J> includes the information on the row error (see a step S4).

Next, the memory control circuit 110 of the first semiconductor device 100 may repair the address ADD<1:N> in response to the row error signal RER to selectively activate one of the first redundancy word lines RWL<1:I>.

Next, if the address ADD<1:N> is not a final address which is fully counted the data may be read out via redundancy word lines, and the semiconductor system may be put into step S2. In contrast, if the address ADD<1:N> is the final address which is fully counted, the semiconductor system may be put into step S7 for terminating the test mode.

Next, if a combination of the address ADD<1:N> having a row error is inputted to the first semiconductor device 100 after the test mode, the memory control circuit 110 of the first semiconductor device 100 may repair the address ADD<1:N> to selectively activate one of the first redundancy word lines RWL<1:I>. The first redundancy area 130 may receive and output the first datum DQ<1> from a memory cell (not shown) connected to one of the first redundancy word lines RWL<1:I>, which is selectively activated. In such a case, the first memory area 120 does not receive or output the first datum DQ<1> because one of the first word lines WL<1:N> corresponding to the address ADD<1:N> is inactivated.

A test method according to yet another embodiment will be described hereinafter with reference to FIG. 4 in conjunction with an example in which a chip error occurs. In such a case, it is assumed that an error occurs in each of the first to fourth semiconductor devices 100, 200, 300 and 400.

First, the medium controller 20 may receive the host address HADD<1:N> that is sequentially counted and may output the host HADD<1:N> as the address ADD<1:N> to put the semiconductor system into the test mode (see the step S1).

Next, the first semiconductor device 100 may output the first datum DQ<1> from the first memory area (120 of FIG. 3) in response to the address ADD<1:N> (see the step S2).

The second semiconductor device 200 may output the second datum DQ<2> from the second memory area (not shown) in response to the address ADD<1:N> (see the step S2).

The third semiconductor device 300 may output the third datum DQ<3> from the third memory area (not shown) in response to the address ADD<1:N> (see the step S2).

The fourth semiconductor device 400 may output the fourth datum DQ<4> from the fourth memory area (not shown) in response to the address ADD<1:N> (see the step S2).

During the step S2, the first to fourth data DQ<1:4> may be sequentially outputted from the semiconductor module 30.

Next, the syndrome generation circuit 221 of the medium controller 20 may receive the first to fourth data DQ<1:4> to generate the syndrome signal S<1:3> (see the step S3). In such a case, the syndrome signal S<1:3> may be generated to include information on the errors of the first to fourth data DQ<1:4>.

The row error sensing circuit 222 of the medium controller 20 may generate the row error signal RER which is disabled in response to the syndrome signal S<1:3> because the syndrome signal S<1:3> includes the information on errors of the first to fourth data DQ<1:4>.

The chip error sensing circuit 223 of the medium controller 20 may generate a chip error signal CER which is enabled in response to the syndrome signal S<1:3> because the syndrome signal S<1:3> includes information on errors of the first to fourth data DQ<1:4>.

Next, the semiconductor system may be put into a step for changing the address ADD<1:N> because the syndrome signal S<1:3> includes information on the chip error (see a step S5).

Next, the address conversion circuit 23 of the medium controller 20 may change a combination of the address ADD<1:N> in response to the chip error signal CER to generate and store the spare address SADD<1:M>.

Next, if the address ADD<1:N> is not a final address which is fully counted the data may be read out via spare word lines, the semiconductor system may be put into step S2. In contrast, if the address ADD<1:N> is the final address which is fully counted, the semiconductor system may be put into step S7 for terminating the test mode.

Next, if a combination of the address ADD<1:N> having the chip error is inputted to the semiconductor module 30 after the test mode, the address conversion circuit 23 of the medium controller 20 may output the spare address SADD<1:M>.

The spare control circuit 140 of the first semiconductor device 100 may decode the spare address SADD<1:M> to selectively activate one of the first spare word lines SWL<1:J> of the first spare area 150, and the spare control circuit of the second semiconductor device 200 may decode the spare address SADD<1:M> to selectively activate one of the second spare word lines of the second spare area 250. Similarly, the spare control circuit of the third semiconductor device 300 may decode the spare address SADD<1:M> to selectively activate one of the third spare word lines of the third spare area 350, and the spare control circuit of the fourth semiconductor device 400 may decode the spare address SADD<1:M> to selectively activate one of the fourth spare word lines of the fourth spare area 450. The first to fourth spare area 150, 250, 350 and 450 may receive and output the first to fourth data DQ<1:4> from memory cells (not shown) connected to the activated spare word lines. In such a case, the first to fourth memory areas and the first to fourth redundancy areas does not receive or output the first to fourth data DQ<1:4>.

According to the test methods described above, a semiconductor system may sense errors of a plurality of semiconductor devices to repair an address if an error occurs in only one of the semiconductor devices and change the address if errors occur in at least two of the semiconductor devices. Thus, no error may occur while the semiconductor system performs a write operation or a read operation.

Figure 5:
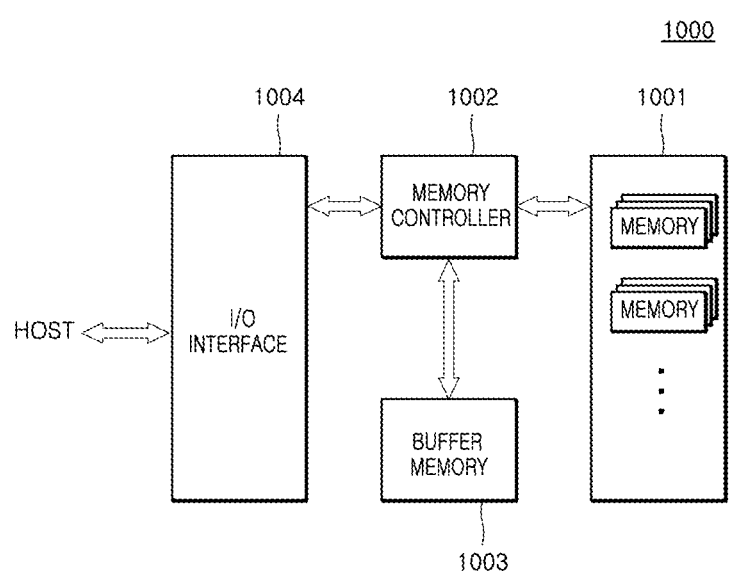
FIG. 5 is a block diagram illustrating a configuration of an electronic system employing the semiconductor system shown in FIGS. 1 to 4.

The semiconductor system described with reference to FIGS. 1 to 4 may be applied to an electronic system that includes a memory system, a graphic system, a computing system, a mobile system, or the like. For example, as illustrated in FIG. 5, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the first to fourth semiconductor devices 100, 200, 300 and 400 illustrated in FIG. 1. Meanwhile, the data storage circuit 1001 may include a nonvolatile memory that can retain stored data even when power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 5 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 6:
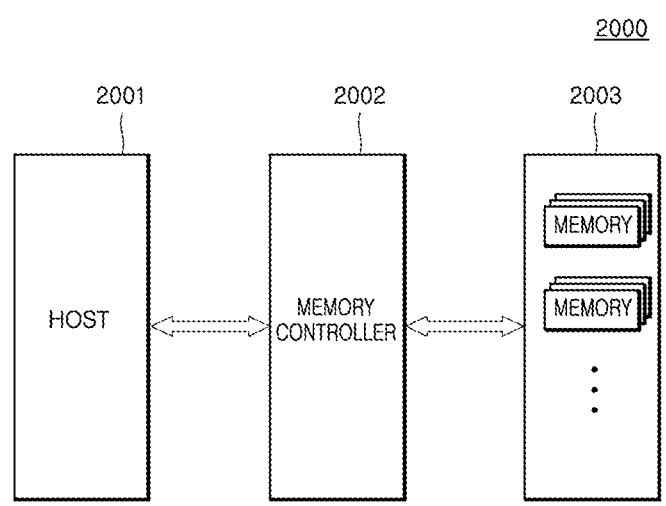
FIG. 6 is a block diagram illustrating a configuration of another electronic system employing the semiconductor system shown in FIGS. 1 to 4.

Referring to FIG. 6, an electronic system 2000 according another embodiment may include a host 2001, a memory controller 2002 and a data storage circuit 2003.

The host 2001 may output a request signal and data to the memory controller 2002 to access the data storage circuit 2003. The memory controller 2002 may supply the data, a data strobe signal, a command, addresses, and a clock signal to the data storage circuit 2003 in response to the request signal, and the data storage circuit 2003 may execute a write operation or a read operation in response to the command. The host 2001 may transmit the data to the memory controller 2002 to store the data into the data storage circuit 2003. In addition, the host 2001 may receive the data outputted from the data storage circuit 2003 through the memory controller 2002. The host 2001 may include a circuit that corrects errors of the data using an error correction code (ECC) scheme.

The memory controller 2002 may act as an interface that connects the host 2001 to the data storage circuit 2003 for communication between the host 2001 and the data storage circuit 2003. The memory controller 2002 may receive the request signal and the data outputted from the host 2001 and may generate and supply the data, the data strobe signal, the command, the addresses, and the clock signal to the data storage circuit 2003 in order to control operations of the data storage circuit 2003. In addition, the memory controller 2002 may supply the data outputted from the data storage circuit 2003 to the host 2001.

The data storage circuit 2003 may include a plurality of memories. The data storage circuit 2003 may receive the data, the data strobe signal, the command, the addresses, and the clock signal from the memory controller 2002 to execute the write operation or the read operation. Each of the memories included in the data storage circuit 2003 may include a circuit that corrects the errors of the data using an error correction code (ECC) scheme. The data storage circuit 2003 may include the semiconductor module 30 of FIG. 1.

In some embodiments, the electronic system 2000 may be realized to selectively operate any one of the ECC circuits included in the host 2001 and the data storage circuit 2003. Alternatively, the electronic system 2000 may be realized to simultaneously operate all of the ECC circuits included in the host 2001 and the data storage circuit 2003. The host 2001 and the memory controller 2002 may be realized in a single chip according to embodiments. The memory controller 2002 and the data storage circuit 2003 may be realized in a single chip according to embodiments.

What is claimed is:

1. A semiconductor system comprising:
   a medium controller configured to output an address that is sequentially counted in a test mode, configured to sense levels of data corresponding to the address in the test mode to determine if the data has a row error or a chip error, and configured to change a combination of a host address to generate and store a spare address if a combination of the address corresponds to the chip error in the test mode; and
   a semiconductor module configured to include a plurality of semiconductor devices,
   wherein each of the semiconductor devices comprises a spare area and a redundancy area,
   wherein the semiconductor module repairs the address to output the data from the redundancy area of a chip if a combination of the address corresponds to the row error, and
   wherein the semiconductor module outputs the data from the spare area selected by the spare address of the chip if a combination of the address corresponds to the chip error,
   wherein the row error corresponds to an error which occurs in any one of the plurality of semiconductor devices; and
   wherein the chip error corresponds to an error which occurs in at least two of the plurality of semiconductor devices.

2. The semiconductor system of claim 1, wherein the plurality of semiconductor devices sequentially output the data from memory areas selected by the address in the test mode.

3. The semiconductor system of claim 1, wherein the medium controller includes:

a buffer circuit configured to buffer the host address to generate the address and configured to buffer host data to output the buffered host data as the data;

an error sensing circuit configured to sense the levels of the data outputted from the plurality of semiconductor devices to generate a row error signal which is enabled if the data have the row error and to generate a chip error signal which is enabled if the data have the chip error; and an address conversion circuit configured to change a combination of the host address in response to the chip error signal to generate and store the spare address in the test mode and configured to output the spare address stored therein if a combination of the host address corresponds to the chip error after the test mode.

4. The semiconductor system of claim 3, wherein the buffer circuit includes:

an address buffer configured to buffer the host address to output the buffered host address as the address; and a data buffer configured to buffer the host data to output the buffered host data as the data.

5. The semiconductor system of claim 3, wherein the error sensing circuit includes:

a syndrome generation circuit configured to sense the levels of the data to generate a syndrome signal including error information on the data in the test mode;

a row error sensing circuit configured to generate the row error signal which is enabled in response to the syndrome signal if the data have the row error; and a chip error sensing circuit configured to generate the chip error signal which is enabled in response to the syndrome signal if the data have the chip error.

6. The semiconductor system of claim 1, wherein the semiconductor module includes:

a first semiconductor device configured to output a first datum from a first memory area in response to the address, configured to receive and output the first datum from a first redundancy area if a combination of the address corresponds to the row error, and configured to receive and output the first datum from a first spare area if a combination of the address corresponds to the chip error; and a second semiconductor device configured to output a second datum from a second memory area in response to the address, configured to receive and output the second datum from a second redundancy area if a combination of the address corresponds to the row error, and configured to receive and output the second datum from a second spare area if a combination of the address corresponds to the chip error, wherein the data includes the first and second data.

7. A semiconductor system comprising:

a medium controller configured to output an address that is sequentially counted in a test mode and configured to sense levels of a first datum and a second datum corresponding to the address in the test mode to determine if the first and second data have a row error or a chip error;

a first semiconductor device configured to include a first memory area, a first redundancy area of a chip and a first spare area of the chip, configured to output the first datum from the first memory area in the test mode, configured to receive and output the first datum from the first redundancy area if a combination of the address corresponds to the row error, and configured to receive and output the first datum from the first spare area if a combination of the address corresponds to the chip error; and a second semiconductor device configured to include a second memory area, a second redundancy area of another chip and a second spare area of the another chip, configured to output the second datum from the second memory area in the test mode, configured to receive and output the second datum from the second redundancy area if a combination of the address corresponds to the row error, and configured to receive and output the second datum from the second spare area if a combination of the address corresponds to the chip error, wherein the row error corresponds to an error which occurs in any one of the first and second semiconductor devices, and wherein the chip error corresponds to an error which occurs in both of the first and second semiconductor devices.

8. The semiconductor system of claim 7, wherein the medium controller includes:

a buffer circuit configured to buffer a host address to generate the address and configured to buffer host data to output the buffered host data as the first and second data;

an error sensing circuit configured to sense the levels of the first and second data outputted from the first and second semiconductor devices to generate a row error signal which is enabled if the first and second data have the row error and to generate a chip error signal which is enabled if the first and second data have the chip error; and an address conversion circuit configured to change a combination of the host address in response to the chip error signal to generate and store a spare address in the test mode and configured to output the spare address stored therein if a combination of the host address corresponds to the chip error after the test mode.

9. The semiconductor system of claim 8, wherein the buffer circuit includes:

an address buffer configured to buffer the host address to output the buffered host address as the address; and a data buffer configured to buffer the host data to output the buffered host data as the first and second data.

10. The semiconductor system of claim 8, wherein the error sensing circuit includes:

a syndrome generation circuit configured to sense the levels of the first and second data to generate a syndrome signal including error information on the first and second data in the test mode;

a row error sensing circuit configured to generate the row error signal which is enabled in response to the syndrome signal if the first and second data have the row error; and a chip error sensing circuit configured to generate the chip error signal which is enabled in response to the syndrome signal if the first and second data have the chip error.

11. The semiconductor system of claim 7, wherein the first semiconductor device includes:

a first memory control circuit configured to decode the address in response to a row error signal to activate a first word line of the first memory area, and configured to repair the address in response to the row error signal to activate a first redundancy word line of the first redundancy area; and a first spare control circuit configured to decode a spare address in response to a chip error signal to activate a first spare word line of the first spare area.

12. The semiconductor system of claim 11,
wherein the first memory area receives and outputs the first datum if the first word line is activated;
wherein the first redundancy area receives and outputs the first datum if the first redundancy word line is activated; and
wherein the first spare area receives and outputs the first datum if the first spare word line is activated.

13. The semiconductor system of claim 7, wherein the second semiconductor device includes:
a second memory control circuit configured to decode the address in response to a row error signal to activate a second word line of the second memory area, and configured to repair the address in response to the row error signal to activate a second redundancy word line of the second redundancy area; and
a second spare control circuit configured to decode a spare address in response to a chip error signal to activate a second spare word line of the second spare area.

14. The semiconductor system of claim 13,
wherein the second memory area receives and outputs the second datum if the second word line is activated;
wherein the second redundancy area receives and outputs the second datum if the second redundancy word line is activated; and
wherein the second spare area receives and outputs the second datum if the second spare word line is activated.

15. A test method comprising:
reading out data from a plurality of semiconductor devices according to a combination of an address that is sequentially counted in a test mode;
sensing levels of the data to determine if the data has a row error or a chip error;
repairing the address to receive and output the data from a redundancy area of a chip if the data have the row error; and
changing a combination of the address to receive and output the data from a spare area of the chip if the data have the chip error,
wherein the row error corresponds to an error which occurs in any one of the plurality of semiconductor devices,
wherein the chip error corresponds to an error which occurs in at least two of the plurality of semiconductor devices, and
wherein each of the semiconductor devices comprises the spare area and the redundancy area.

16. The test method of claim 15,
wherein repairing the address is followed by sensing an end of the test mode to determine termination of the test mode; and
wherein changing the combination of the address is followed by sensing the end of the test mode to determine the termination of the test mode.

17. The test method of claim 15,
wherein sensing the levels of the data is followed by sensing end of the test mode if no error is in the data; and
wherein sensing the end of the test mode is followed by reading out the data if the address sequentially counted is not a final address.

* * * * *